United States Patent
Ou et al.

(10) Patent No.: US 9,287,763 B2
(45) Date of Patent: Mar. 15, 2016

(54) DUTY CYCLE BALANCE MODULE FOR SWITCH MODE POWER CONVERTER

(71) Applicant: Analog Devices Global, Hamilton (BM)

(72) Inventors: Yingyang Ou, Shenzhen (CN); Renjian Xie, Shenzhen (CN); Huailiang Sheng, Shanghai (CN)

(73) Assignee: Analog Devices Global (BM)

( * ) Notice: Subject to any disclaimer, the term of this patent is extended or adjusted under 35 U.S.C. 154(b) by 0 days.

(21) Appl. No.: 14/738,351

(22) Filed: Jun. 12, 2015

(65) Prior Publication Data

US 2015/0280543 A1  Oct. 1, 2015

Related U.S. Application Data

(63) Continuation of application No. 13/735,481, filed on Jan. 7, 2013, now Pat. No. 9,099,932.

(51) Int. Cl.
*H02M 3/335* (2006.01)
*H02M 1/08* (2006.01)
(Continued)

(52) U.S. Cl.
CPC *H02M 1/08* (2013.01); *H02M 1/40* (2013.01); *H02M 3/33507* (2013.01); *H03K 17/56* (2013.01); *H02M 3/33576* (2013.01); *H02M 2007/4803* (2013.01)

(58) Field of Classification Search
CPC . H02M 3/28; H02M 3/33569; H02M 3/3376; H02M 3/338; H02M 7/5387; H02M 7/53871

USPC ............ 363/15, 16, 17, 21.18, 56.02, 98, 132
See application file for complete search history.

(56) References Cited

U.S. PATENT DOCUMENTS 7,715,217 B2 *  5/2010  Manabe ............... B60L 11/1887
                                                    363/41
8,385,085 B2    2/2013  Hattori et al.
(Continued)

OTHER PUBLICATIONS

"U.S. Appl. No. 13/735,481, Non Final Office Action mailed Oct 22, 2014", 15 pgs.

(Continued)

*Primary Examiner* — Nguyen Tran
(74) *Attorney, Agent, or Firm* — Schwegman Lundberg & Woessner, P.A.

(57) ABSTRACT

A duty cycle balance module (DCBM) for use with a switch mode power converter. One possible half-bridge converter embodiment includes a transformer driven to conduct current in first and second directions by first and second signals during and second half-cycles, respectively. A current limiting mechanism adjusts the duty cycles of the first and second signals when a sensed current exceeds a predetermined limit threshold. The DCBM receives signals representative of the duty cycles which would be used if there were no modification by the current limiting mechanism and signals $D_{act\_1}$ and $D_{act\_2}$ representative of the duty cycles that are actually used for the first and second signals, and outputs signals $D_{bl\_1}$ and $D_{bl\_2}$ which modify signals $D_{act\_1}$ and $D_{act\_2}$ as needed to dynamically balance the duty cycles of the first and second signals and thereby reduce flux imbalance in the transformer that might otherwise arise.

20 Claims, 14 Drawing Sheets

(51) Int. Cl.
  *H02M 1/40* (2007.01)
  *H03K 17/56* (2006.01)
  *H02M 7/48* (2007.01)

(56) References Cited

U.S. PATENT DOCUMENTS

| 8,385,092 | B1 | 2/2013 | Shekhawat |
| 9,099,932 | B2 | 8/2015 | Ou et al. |
| 2010/0142228 | A1 | 6/2010 | Yamauchi et al. |
| 2014/0192560 | A1 | 7/2014 | Ou et al. |

OTHER PUBLICATIONS

"U.S. Appl. No. 13/735,481, Notice of Allowance mailed Mar. 30, 2015", 7 pgs.

"U.S. Appl. No. 13/735,481, Response filed Feb. 20, 2015 to Non Final Office Action mailed Nov. 22, 2014", 24 pgs.

* cited by examiner

| HALF-CYCLES | 1 | 2 | 3 | 4 | 5 | 6 | 7 | 8 | 9 | 10 | 11 | 12 |
|---|---|---|---|---|---|---|---|---|---|---|---|---|
| Dnor_1 | 45% |  | 45% |  | 45% |  | 45% |  | 45% |  | 45% |  |
| Dnor_2 |  | 45% |  | 45% |  | 45% |  | 45% |  | 45% |  | 45% |
| Dact_1 | 45% |  | 40.5% |  | 4.5% |  | 4.5% |  | 4.5% |  | 45% |  |
| Dact_2 |  | 45% |  | 23% |  | 45% |  | 9% |  | 45% |  | 45% |
| Dloss_1 | 0 |  | 4.5% |  | 40.5% |  | 0 |  | 40.5% |  | 0 |  |
| Dloss_2 |  | 0 |  | 22% |  | 0 |  | 36% |  | 0 |  | 0 |
| Dmis | 0 | 0 | 4.5% | 17.5% | 23% | 23% | 23% | 13% | 27.5% | 27.5% | 27.5% | 27.5% |

*FIG. 4B*

| HALF-CYCLES | 1 | 2 | 3 | 4 | 5 | 6 | 7 | 8 | 9 | 10 | 11 | 12 |
|---|---|---|---|---|---|---|---|---|---|---|---|---|
| Dnor_1 | 45% | | 45% | | 45% | | 45% | | 45% | | 45% | |
| Dnor_2 | | 45% | | 45% | | 45% | | 45% | | 45% | | 45% |
| Dbl_1 | 45% | | 45% | | 27% | | 45% | | 9% | | 45% | |
| Dbl_2 | | 45% | | 40.5% | | 22.5% | | 45% | | 40.5% | | 45% |
| Dact_1 | 45% | | 40.5% | | 4.5% | | 45% | | 4.5% | | 45% | |
| Dact_2 | | 45% | | 22.5% | | 22.5% | | 9% | | 40.5% | | 45% |
| Dloss_1 | 0 | | 4.5% | | 40.5% | | 0 | | 40.5% | | 0 | |
| Dloss_2 | | 0 | | 22.5% | | 22.5% | | 36% | | 4.5% | | 0 |
| Dmis | 0 | 0 | 4.5% | 18% | 22.5% | 0 | 0 | 36% | 4.5% | 0 | 0 | 0 |

*FIG. 6B*

| HALF-CYCLES | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|
| Dnor_1 | 45% | | 45% | | 45% | | 45% | | 45% | | 45% | | 45% | | 45% | | 45% | |
| Dnor_2 | | 45% | | 45% | | 45% | | 45% | | 45% | | 45% | | 45% | | 45% | | 45% |
| Dini | 0 | 0 | 0 | 40.5% | 22.5% | 4.5% | 4.5% | 4.5% | 9% | 4.5% | 4.5% | 4.5% | 4.5% | 4.5% | 4.5% | 4.5% | 0 | 0 |
| Dinc_tot | 0 | 0 | 0 | 4.5% | 4.5% | 4.5% | 9% | 13.5% | 4.5% | 4.5% | 9% | 13.5% | 18% | 22.5% | 27% | 31.5% | 0 | 0 |
| Dbl_1 | 45% | | 45% | | 27% | | 13.5% | | 13.5% | | 13.5% | | 22.5% | | 31.5% | | 45% | |
| Dbl_2 | | 45% | | 45% | | 9% | | 18% | | 9% | | 18% | | 27% | | 36% | | 45% |
| Dact_1 | 45% | | 40.5% | | 4.5% | | 13.5% | | 4.5% | | 13.5% | | 22.5% | | 31.5% | | 45% | |
| Dact_2 | | 45% | | 22.5% | | 9% | | 9% | | 9% | | 18% | | 27% | | 36% | | 45% |
| Dloss_1 | 0 | | 4.5% | | 40.5% | 36% | 31.5% | 36% | 40.5% | 36% | 30.5% | 27% | 22.5% | 18% | 13.5% | | 0 | |
| Dloss_2 | | 0 | | 18% | 22.5% | 13.5% | 18% | 18% | 22.5% | 13.5% | 18% | 9% | 13.5% | 4.5% | 9% | 9% | | 0% |
| Dmis | 0 | 0 | 4.5% | | | | | | | | | | | | | 0 | 0 | 0 |

*FIG. 7B*

| HALF-CYCLES | 1 | 2 | 3 | 4 | 5 | 6 | 7 | 8 | 9 | 10 | 11 | 12 |
|---|---|---|---|---|---|---|---|---|---|---|---|---|
| Dnor_1 | 45% |  | 45% |  | 45% |  | 45% |  | 45% |  | 45% |  |
| Dnor_2 |  | 45% |  | 45% |  | 45% |  | 45% |  | 45% |  | 45% |
| Dbl_1 | 45% |  | 45% |  | 22.5% |  | 45% |  | 9% |  | 45% |  |
| Dbl_2 |  | 45% |  | 40.5% |  | 4.5% |  | 45% |  | 45% |  | 45% |
| Dact_1 | 45% |  | 40.5% |  | 4.5% |  | 45% |  | 4.5% |  | 45% |  |
| Dact_2 |  | 45% |  | 22.5% |  | 4.5% |  | 9% |  | 4.5% |  | 45% |
| Dloss_1 | 0 |  | 4.5% |  | 18% |  | 0 |  | 4.5% |  | 0 |  |
| Dloss_2 |  | 0 |  | 18% |  | 0 |  | 36% |  | 0 |  | 0 |
| Dmis | 0 | 0 | 4.5% | 13.5% | 4.5% | 4.5% | 4.5% | 31.5% | 27% | 27% | 27% | 27% |

*FIG. 8B*

DUTY CYCLE BALANCE MODULE FOR SWITCH MODE POWER CONVERTER

CLAIM OF PRIORITY

This application is a continuation of U.S. patent application Ser. No. 13/735,481, filed Jan. 7, 2015, which is hereby incorporated by reference herein in its entirety.

BACKGROUND OF THE INVENTION

1. Field of the Invention

This invention relates generally to switch mode power converters which include an electromagnetic component, and more particularly to techniques designed to maintain the flux balance in an electromagnetic component of such a converter.

2. Description of the Related Art

There are a number of switch mode converter topologies which include an electromagnetic component such as a transformer or motor; examples include half-bridge, full-bridge, 4-switch buck-boost and push-pull topologies. In normal operation, the electromagnetic component conducts a current which periodically reverses direction. This results in a magnetic flux in the component which, if not kept balanced, can result in flux saturation and output voltage regulation failure.

The operation of such a converter 10 is illustrated with reference to FIG. 1, which depicts a half-bridge switch mode converter topology. On the primary side of the converter, a control unit 12 provides 'switch drive' signals 14 to switching elements Q1 and Q2 to control the direction of current through the primary winding of a transformer T1; the converter operates with an associated switching cycle, during which current flows through T1 in both positive and negative directions. A capacitor divider network consisting of capacitors C1 and C2 is connected as shown; ideally, C1 and C2 have the same capacitance value, and the average voltages across them in one switching period are equal. When this is the case, the voltage at central node B is Vin/2, where Vin is the DC input voltage. The secondary side of the converter includes the secondary winding of T1, synchronous rectifiers Q3 and Q4, and an output inductor and capacitor across which the converter's output voltage Vo is provided. The primary and secondary sides together are referred to herein as the 'main stage'.

One switching cycle can be divided into two half-cycles, during which switches Q1 and Q2 conduct alternatively. For example, in a first half-cycle, Q1 is turned on and Q2 is turned off, and C1 discharges through Q1 and T1 while C2 is charged. In a second half-cycle, Q1 is turned off and Q2 is turned on, C1 is charged by input voltage Vin, and C2 discharges through Q2 and T1. The ON time of Q1 or Q2 (or the duty cycle) in each half-cycle is controlled, typically using pulse-width (PWM) or pulse-frequency modulation (PFM), to regulate the output voltage Vo.

However, due to variations between, for example, the capacitances of C1 and C2 and the delay times for the switch drive signals, the voltage at center node B may drift up or down over time. However, when the converter employs "voltage-mode" control, the voltage drift at the center node B of the capacitor divider acts as negative feedback which prevents transformer T1 from becoming saturated.

But even with voltage-mode control, a magnetic flux balance problem can develop when a current in the main stage exceeds a predetermined limit threshold. A voltage-mode control system typically does not have a peak current limit function as is commonly found in a peak current-mode control system. This is usually remedied with the addition of an additional current limit module; one possible module is referred to herein as a "cycle-by-cycle limit module", which senses the real time current in the main stage and compares it with a reference limit signal. This module senses short circuit or over-current conditions, and responds by limiting the primary side or secondary side current in each half-cycle. Once this reference limit is reached or exceeded, an over-current flag may be generated to shut down the switch drive signals. Then, the system may enter a cycle-by-cycle limit mode during which the switch drive signals in the first and/or second half-cycles of a switching period are terminated whenever the sensed current reaches the reference limit.

However, as a result of the operation of a cycle-by-cycle limit module, the switch drive signals may be terminated such that they have different ON times in the two half-cycles. This is a duty cycle (or ON time) imbalance. As a result, the capacitor discharging during the half-cycle which has a longer ON time discharges more current than does the capacitor discharging in the half-cycle with the shorter ON time. This causes the voltage on the capacitor which discharges longer to be lower than the voltage on the other capacitor. It is known that if the voltage applied across the transformer in one half-cycle is different from the voltage applied in the other half-cycle, the rate at which the transformer current increases in one half-cycle will be different from the increase rate in the other half-cycle. As such, the current in the longer ON time half-cycle needs more time to reach the reference limit than does the current in the short ON time half-cycle. In fact, the other capacitor gets charged to a higher voltage and requires a shorter ON time to let the current hit the reference limit. Therefore, after a series of duty cycle (or ON time) imbalances over a number of half-cycles, the center node voltage of the capacitor divider can drift from Vin/2 towards either the ground or the input voltage. This simple cycle-by-cycle limit module always reinforces this trend, which can lead to flux saturation in the main transformer, output voltage regulation failure, and high voltage stress across the drain and source terminals of the synchronous rectifiers on the converter's secondary side.

SUMMARY OF THE INVENTION

A duty cycle balance module (DCBM) for a switch mode power converter is presented which overcomes the problems discussed above, providing a means to balance the duty cycle or ON times of the switch drive signals dynamically—thereby reducing or eliminating the mismatch that may arise due to a current limiting mechanism.

The present DCBM is for use with a switch mode power converter that may be arranged in any of a number of topologies, including full-bridge, half-bridge, push-pull or 4-signal buck-boost topologies. The module is adaptable for use with converters employing two or four switch drive signals using simple hard switching modulation, or with a configuration using four signal phase-shift switching modulation.

One possible converter embodiment is arranged such that the converter's electromagnetic component is driven to conduct current in a first direction during a first half-cycle by a first signal having an associated on- and off-time during each first half-cycle and in a second direction during a second half-cycle by a second signal having an associated on- and off-time during each second half-cycle. The first and second half-cycles have associated periods and together constitute a switching cycle. The first and second signals have an associated duty cycle defined as the ratio of their respective ON times to the period of the switching cycle. The converter further includes a current limiting mechanism which senses a current in the converter and adjusts the duty cycles of at least one of the first and second signals when the sensed current exceeds a predetermined limit threshold. For this embodiment, the DCBM comprises:

an input block which receives signals $D_{nor\_1}$ and $D_{nor\_2}$ representative of the duty cycles or ON times which would be used for the first and second signals, respectively, to achieve a desired result if the duty cycles were not modified by the current limiting mechanism, and signals $D_{act\_1}$ and $D_{act\_2}$ representative of the duty cycles or ON times that are actually used for the first and second signals; and an output block which provides output signals $D_{bl\_1}$ and $D_{bl\_2}$, the DCBM arranged such that $D_{bl\_1}$ and $D_{bl\_2}$ modify signals $D_{act\_1}$ and $D_{act\_2}$ as needed in response to the received signals so as to dynamically balance the duty cycles of the first and second signals and thereby reduce or eliminate the flux imbalance in the electromagnetic component that might otherwise arise.

These and other features, aspects, and advantages of the present invention will become better understood with reference to the following description and claims.

BRIEF DESCRIPTION OF THE DRAWINGS

FIG. 4b is a table illustrating the operation of the half-bridge switch mode converter associated with the timing diagram of FIG. 4a.

FIG. 6b is a table illustrating the operation of the half-bridge switch mode converter associated with the timing diagram of FIG. 6a.

FIG. 7b is a table illustrating the operation of the half-bridge switch mode converter associated with the timing diagram of FIG. 7a.

FIG. 8b is a table illustrating the operation of the half-bridge switch mode converter associated with the timing diagram of FIG. 8a.

FIG. 9b is a timing diagram illustrating one possible modulation technique that might be used with a full-bridge switch mode converter as shown in FIG. 9a.

FIG. 9c is a timing diagram illustrating another possible modulation technique that might be used with a full-bridge switch mode converter as shown in FIG. 9a.

DETAILED DESCRIPTION OF THE INVENTION

Figure 1:
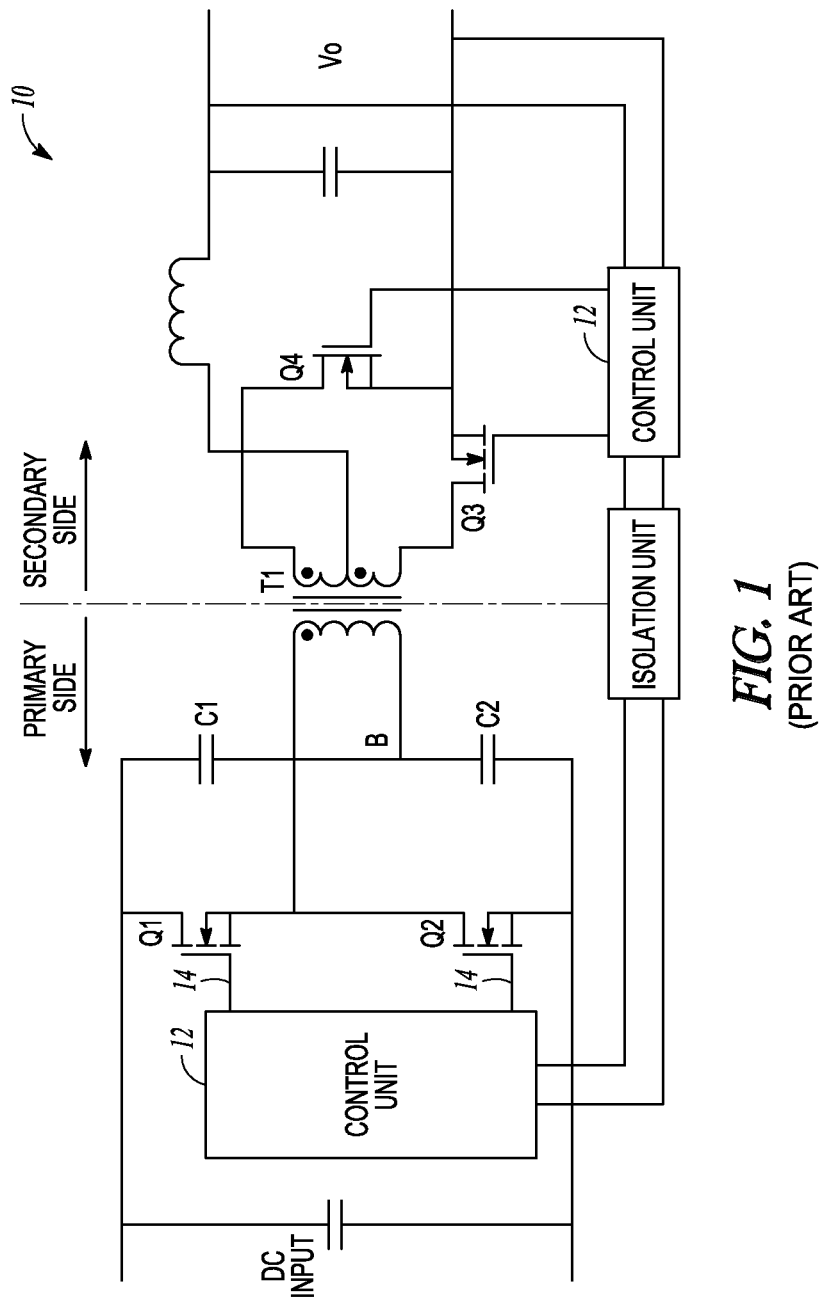
FIG. 1 is a schematic diagram of a known half-bridge switch mode converter.

The present DCBM operates to maintain magnetic flux balance while a current limiting mechanism is affecting the operation of a switch mode converter, by reducing or eliminating the mismatch of duty cycles caused by the current limiting mechanism. In general, if the duty cycle of one switch drive signal is terminated early because of current limiting, a matched duty cycle is applied to the other switch for the next half switching cycle, regardless of the current condition. Matching the duty cycles in this way helps to maintain volt-second balancing in the transformer and to prevent transformer saturation.

For purposes of clarity, similar reference numbers will be used in the drawings to identify similar elements. As used herein, the terms "module" or "block" generally refer to, but shall not be limited to, any one or a combination of an application specific integrated circuit (ASIC), a digital, analog, or hybrid electronic circuit, a processor (shared, dedicated or group) and memory that execute one or more software or firmware programs, a combinatorial logic circuit, and/or other suitable components that provide the described functionality. The various embodiments will be described in connection with a half-bridge switch mode converter, though as noted above, the present DCBM is equally applicable to use with various other converter topologies, including, by way of non-limiting example, full-bridge, push-pull and 4-signal buck-boost topologies.

Figure 2:
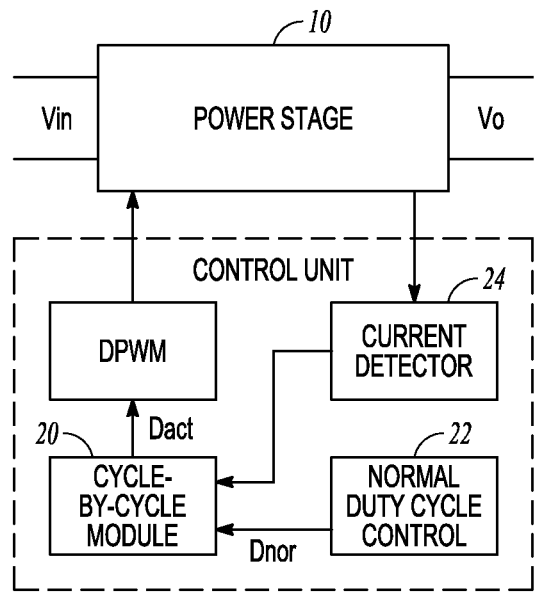
FIGS. 2 and 10 are block diagrams of a control unit for a half-bridge switch mode converter.

A basic control unit 12 for a switch mode converter such as that shown in FIG. 1 is illustrated in FIG. 2. A current limiting mechanism—here, a cycle-by-cycle limit module 20—receives duty cycle information in the form of a signal $D_{nor}$ from a normal duty cycle control unit 22; $D_{nor}$ is representative of the 'normal' duty cycle which would be used for a switch drive signal to achieve a desired result if the duty cycles were not modified by the current limiting mechanism. One or more current detectors 24 are included as a part of control unit 12, which detect the current at one or more nodes in the primary or secondary sides of the converter.

Figure 3:
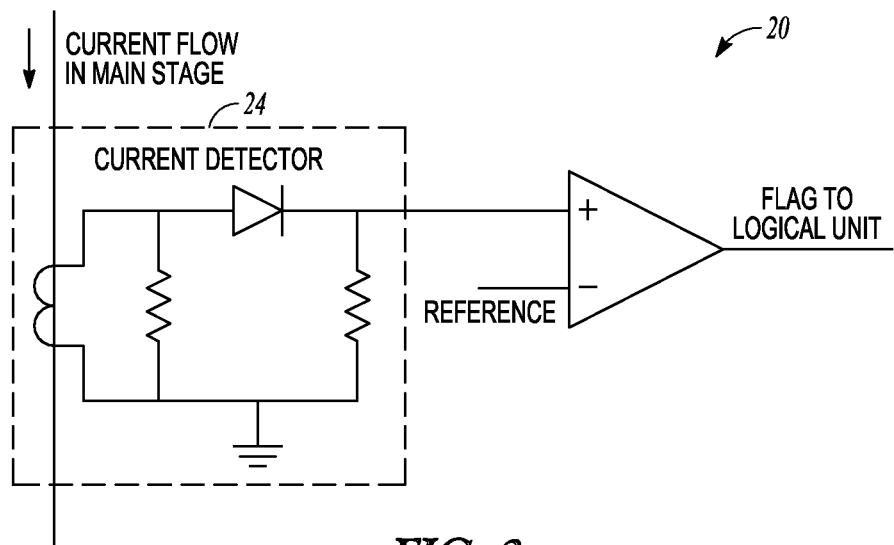
FIG. 3 is a schematic diagram of a current detector circuit as might be used with the control unit of FIG. 2.

One possible implementation of a current detector 24 is shown in FIG. 3. When the current being sensed reaches or exceeds a reference limit threshold, which can be fixed, programmed, or configured by users, a flag can be generated and sent to cycle-by-cycle limit module 20 (and other logic modules as needed). The current being sensed can be any main stage current of interest, including, for example, the current in Q1, Q2, T1, or the input current, or on the secondary side, the current in Q3, Q4, the output inductor, or the return line. Cycle-by-cycle limit module 20 is arranged to respond to such a flag by modifying the duty cycle of one or more switch drive signals. This modified duty cycle, represented with a signal $D_{act}$, is sent to a Digital Pulse Width Modulator (DPWM), which generates the actual switch drive signals; cycle-by-cycle limit module 20 might also be arranged to terminate all (or some) of the switch drive signals immediately, or after a predetermined time (this time may be an inherent delay, a response time or a debounce time which can be set by users) to limit the peak current via the DPWM. Note that signals identified herein as, for example, $D_{nor}$ and $D_{act}$, actually refer to at least two signals, such as $D_{nor\_1}$ and $D_{nor\_2}$ or $D_{act\_1}$ and $D_{act\_2}$, for the normal and actual duty cycle signals generated for first and second half-cycles.

Figure 4A:
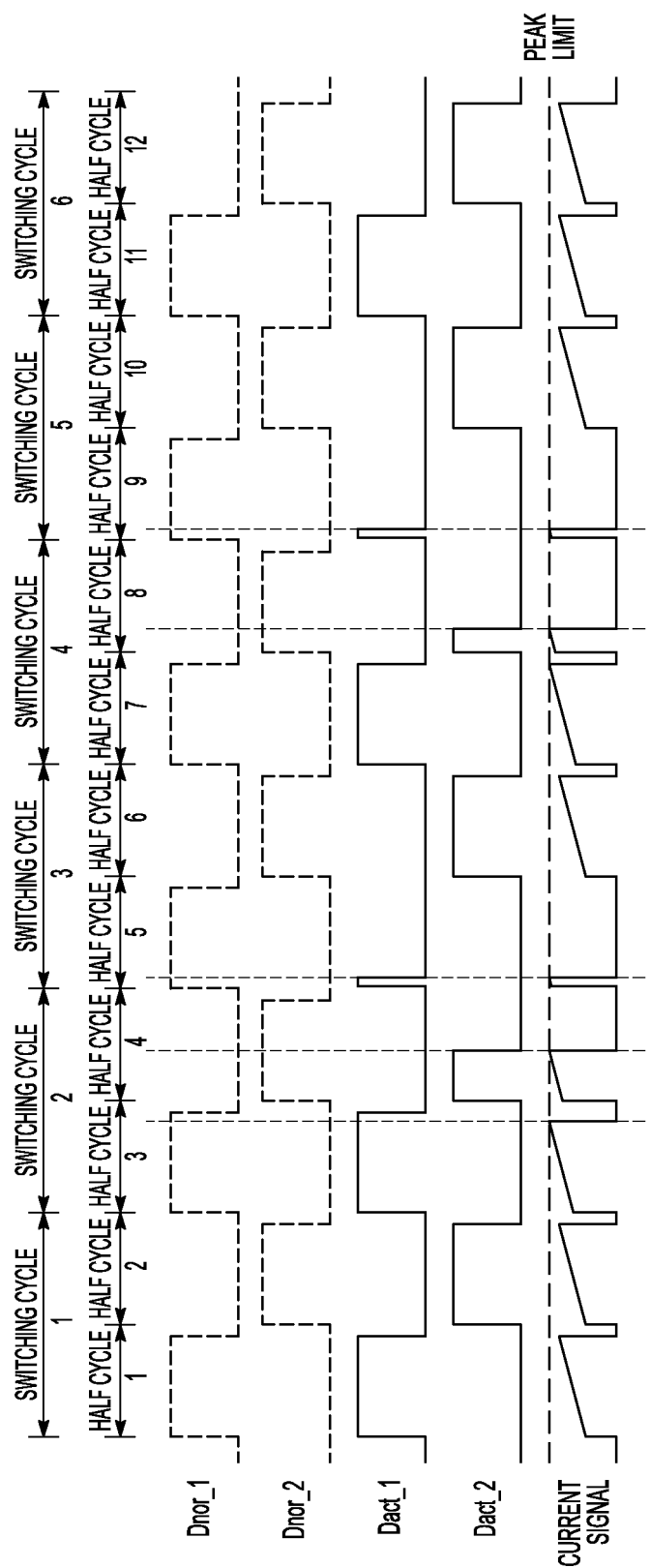
FIG. 4a is a timing diagram for a half-bridge switch mode converter which includes a cycle-by-cycle limit module.

The timing diagram in FIG. 4a illustrates the operation of a switch mode power converter such as the half-bridge converter shown in FIG. 1, which uses a cycle-by-cycle limit module. The diagram includes the normal duty cycle signals $D_{nor\_1}$ and $D_{nor\_2}$ for the first and second half-cycles, respectively, in every switching cycle—these can be the considered to represent what the switch drive signals would look like without the effect of the cycle-by-cycle limit module. These may be, for example, unregulated or regulated PWM or PFM signals, from a closed loop such as a control loop, adaptive dead time loop, voltage-second balance loop, etc., or even PWM signals limited by a max duty cycle (ON time) limit. The diagram also includes the actual switch drive signals $D_{act\_1}$ and $D_{act\_2}$ for the first and second half-cycles, respectively, in every switching cycle, the sensed current signal, and a line representing the reference limit threshold for the sensed current—labeled 'peak limit'. At the beginning (half-cycles 1 and 2), it is assumed that the half-bridge converter works normally, such that $D_{nor\_1}=D_{act\_1}$ and $D_{nor\_2}=D_{act\_2}$. However, the current signal hits the peak limit during half-cycles 3, 4, 5, 8 and 9, causing the cycle-by-cycle limit module to immediately terminate the switch drive signals during those half-cycles. When this happens in a first half-cycle, $D_{act\_1}<D_{nor\_1}$, and when this happens in a second half-cycle, $D_{act\_2}<D_{nor\_2}$. As mentioned above, an imbalance between the duty cycles of the switch drive signals can result in magnetic flux saturation and system malfunction.

For the purposes of clarity, the following discussion will only refer to "duty cycle", but "ON time" could be substituted for "duty cycle" if the switching frequency does not change. The amount of duty cycle lost due to the action of the cycle-by-cycle limit module in each half-cycle is given by:

$$D_{loss\_1}=D_{nor\_1}-D_{act\_1}$$

$$D_{loss\_2}=D_{nor\_2}-D_{act\_2}$$

where $D_{loss\_1}$ is the duty cycle lost in the first half-cycle of every switching cycle (half-cycles 1, 3, 5, 7, 9, 11, etc.), $D_{loss\_2}$ is the duty cycle lost in the second half-cycle of every switching cycle (half-cycles 2, 4, 6, 8, 10, 12, etc.), $D_{nor\_1}$ and $D_{nor\_2}$ are the normal duty cycles in the first and second half-cycles, respectively, of every switching cycle, and $D_{act\_1}$ and $D_{act\_2}$ are the actual duty cycles in the first and second half-cycles, respectively, of every switching cycle.

Therefore, the duty cycle mismatch Dims cycle between the two half-cycles in every switching cycle is given by:

$$D_{mis\_cycle}=|D_{loss\_1}-D_{loss\_2}|$$

Over multiple periods of overcurrent, the total duty cycle mismatch $D_{mis}$ is accumulated as follows:

$$D_{mis}=|\Sigma D_{loss\_1}-\Sigma D_{loss\_2}|$$

A numerical calculation of the duty cycle mismatch caused by the cycle-by-cycle limit module is presented in the table shown in FIG. 4b. It is assumed that during normal operation, the duty cycle in each switching cycle is 45%, and there is no duty cycle mismatch between the first and second half-cycles caused by the cycle-by-cycle limit module prior to half-cycle 1. After the cycle-by-cycle limit module takes action, duty cycle mismatch arises. If the overcurrent condition persists, the voltage at central node B shown in FIG. 1 will eventually drift to ground or to the input voltage, thus preventing the normal operation of the converter.

Figure 5:
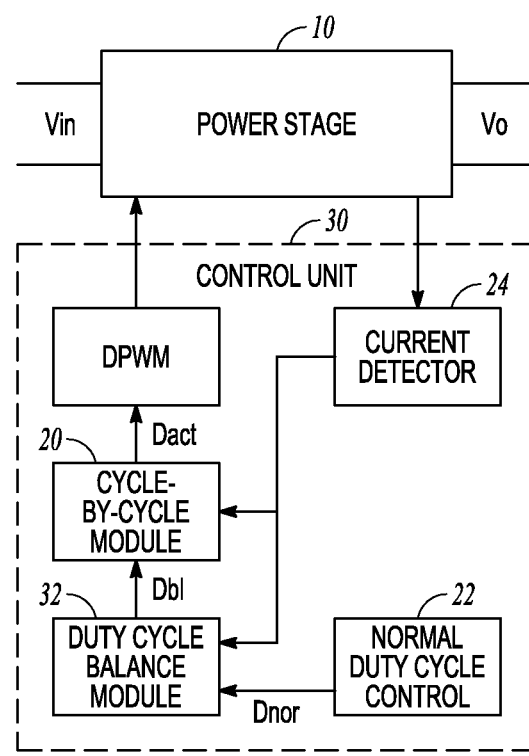
FIG. 5 is a block diagram of a control unit which includes a DCBM as described herein.

To eliminate the mismatch caused by the current limiting mechanism, the duty cycle must be balanced dynamically. This is accomplished with a DCBM as described herein. The use of such a module is illustrated in the block diagram of a control unit 30 shown in FIG. 5. The normal duty cycle control unit 24 sends out the normal duty cycle signal $D_{nor}$ as before. Here, however, $D_{nor}$ is sent to a DCBM 32 instead of a cycle-by-cycle limit module. The DCBM may modify the duty cycle as described herein, and outputs a balanced duty cycle signal $D_{bl}$ to cycle-by-cycle limit module 20. As before, cycle-by-cycle limit module 20 then provides actual duty cycle signal Dad to the DPWM which generates the actual switch drive signals.

Three possible embodiments of the present DCBM are now described. In the first embodiment ("proposal 1"), the duty cycle is compensated in every half-cycle according to the duty cycle loss calculation. The operating principles are as below:

the actual output duty cycle $D_{act}$ (or the pulse width) must be recorded every half-cycle, or the DCBM starts to record $D_{act}$ once the cycle-by-cycle limit is triggered.

the output of the DCBM $D_{bl}$ is compensated every half-cycle according to the total duty cycle loss, according to the equations below:

$$D_{bl\_1}=D_{nor\_1}-D_{mis}$$

during the first half-cycle, and $$D_{bl\_2}=D_{nor\_2}-D_{mis}$$

during the second half-cycle.

$D_{nor\_1}, D_{nor\_2}$ and $D_{mis}$ are as defined above.

The cycle-by-cycle limit always has the highest priority. This means that after the cycle-by-cycle limit module receives the balanced duty cycle signal $D_{bl}$ from the DCBM, the cycle-by-cycle limit module can also terminate the switch drive signals if an overcurrent is detected while the drive signals are still commanding the switching elements to be on.

Once the following condition is met:

$$D_{bl\_1} \geq D_{nor\_1} \text{ and } D_{bl\_2} \geq D_{nor\_2}$$

or $$D_{mis}=0,$$

the duty cycle imbalance has been corrected. The DCBM can then be bypassed and re-activated when the cycle-by-cycle limit is again exceeded. Alternatively, the DCBM can run on the principle of:

$$D_{bl\_1}=D_{nor\_1}-D_{mis} \text{ and } D_{bl\_2}=D_{nor\_2}-D_{mis}.$$

In accordance with the principles described above, $D_{nor\_1}$ and $D_{nor\_2}$ may be modified by the DCBM and outputted as $D_{bl\_1}$ and $D_{bl\_2}$. These duty cycles can still be affected by the cycle-by-cycle limit module. Therefore, the inputs $D_{act\_1}$ and $D_{act\_2}$ to the DPWM may be equal to $D_{bl\_1}$ and $D_{bl\_2}$, or at a lower value.

Figure 6A:
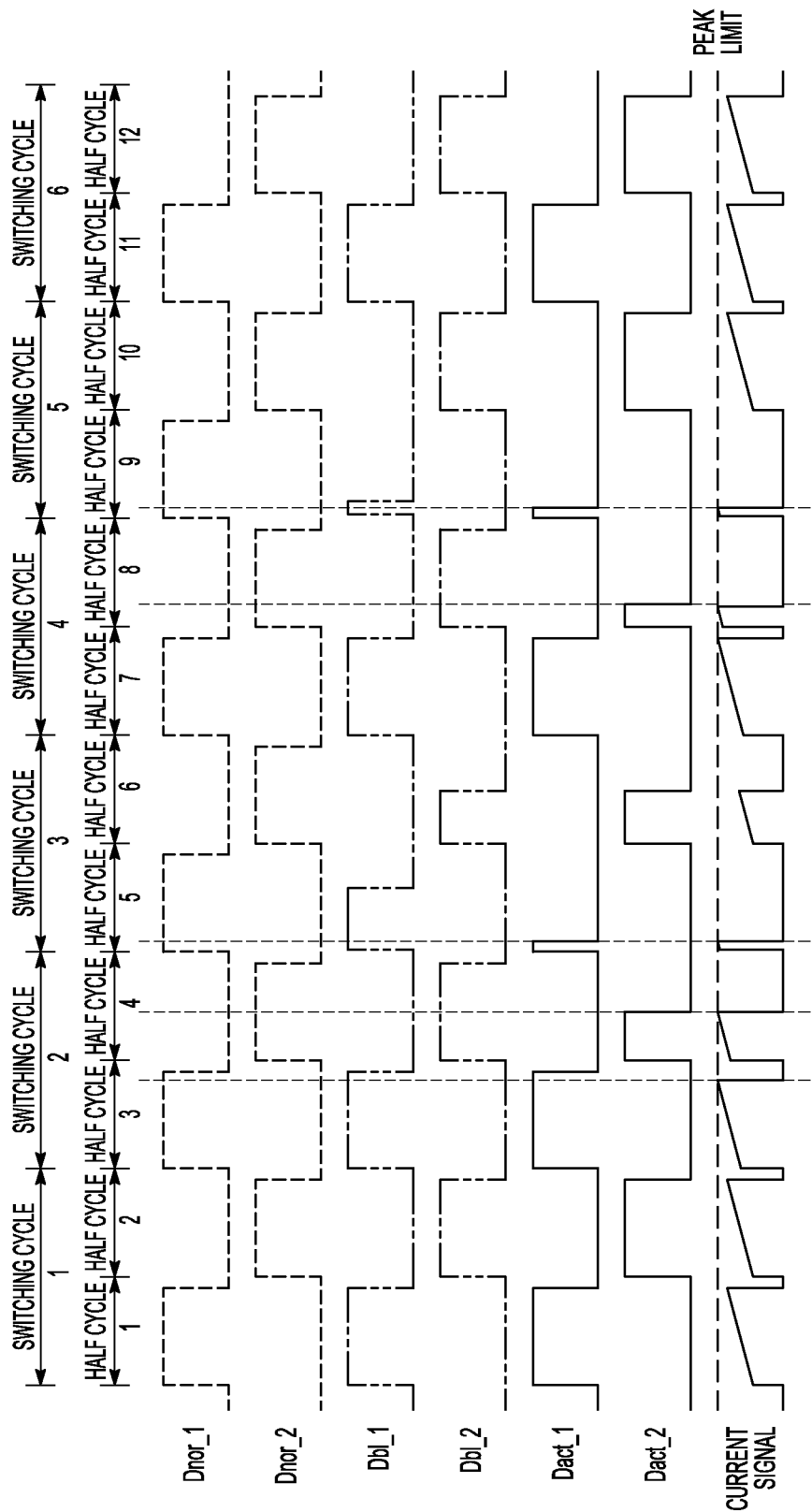
FIG. 6a is a timing diagram for a half-bridge switch mode converter which includes a cycle-by-cycle limit module and one possible implementation of a DCBM as described herein.

The example discussed above in relation to FIGS. 4a and 4b is again analyzed with a DCBM per proposal 1; this analysis is shown in FIGS. 6a and 6b. $D_{bl\_1}$ and $D_{bl\_2}$ are defined as the duty cycles outputted by the DCBM in the first and second half-cycles, respectively, of every switching cycle. From the waveforms shown in FIG. 6a, duty cycle signals $D_{bl\_1}$ and $D_{bl\_2}$ are limited by the DCBM in half-cycles 4, 5, 6, 9 and 10, before they are sent to the cycle-by-cycle limit module. The reduced value is equal to the difference between the accumulated duty cycle mismatch and the normal duty cycle, as given by the proposal 1 equations shown above.

The table shown in FIG. 6b gives numerical calculation results for the proposal 1 example shown in FIG. 6a. When a half-cycle occurs during without the switch drive signals being terminated, the duty cycle imbalance can be eliminated in this half-cycle; this is seen in, for example, half-cycles 6 and 10 in FIGS. 6a and 6b, where $D_{mis}=0$. Note that during normal operation, the DCBM has no effect on the normal duty cycle.

In a second embodiment ("proposal 2"), the DCBM forces the duty cycle to recover to its normal value gradually, with multiple increment steps, once the cycle-by-cycle limit module takes action. The DCBM for this embodiment is implemented on the following principles:

- the actual output duty cycles $D_{act\_1}$ and $D_{act\_2}$ (or pulse widths) must be recorded every half-cycle, or the module starts to record $D_{act\_1}$ and $D_{act\_2}$ once the cycle-by-cycle limit module is triggered.
- once the cycle-by-cycle limit module is triggered, the recorded duty cycle ($D_{act\_1}$ or $D_{act\_2}$) in the current half-cycle is recorded as $D_{ini}$, and a 'half-cycle number' k is set to 0; this value can increase by 1 every half-cycle.
- the output duty cycles of the DCBM in the following half-cycles are adjusted step-by-step, in accordance with the following equations:

$$D_{bl\_1}[k]=D_{bl\_1}[k-1]+D_{inc} \text{ and}$$

$$D_{bl\_2}[k]=D_{bl\_2}[k-1]+D_{inc}$$

where $D_{ini}$ is the actual duty cycle when the cycle-by-cycle limit was last exceeded; $D_{inc}$ is the increment of duty cycle in every half-cycle and may be fixed, calculated or made variable by programming in every half-cycle; $D_{bl\_1}[k]$ or $D_{bl\_2}[k]$ is the output duty cycle of the DCBM in the current half-cycle, and $D_{bl\_1}[k-1]$ or $D_{bl\_2}[k-1]$ is the output duty cycle of the DCBM in the previous half-cycle. $D_{bl\_1}[0]$ and $D_{bl\_2}[0]$ are equal to $D_{ini}$.

Once the following conditions are met:

$$D_{bl\_1}[k] \geq D_{nor\_1}[k] \text{ and } D_{bl\_2}[k] \geq D_{nor\_2}[k], \text{ or } D_{mis}=0,$$

the duty cycle imbalance has been corrected. Then, $D_{bl\_1}[k]=D_{nor\_1}[k]$, $D_{bl\_2}[k]=D_{nor\_2}[k]$, and the DCBM can be bypassed and re-activated when the cycle-by-cycle limit is again exceeded. Alternatively, the DCBM can continue operation on the principles described above, with $D_{inc}$ just set to 0.

The cycle-by-cycle limit module always has the highest priority. Thus, after the duty cycle $D_{bl}$ is balanced by the DCBM, the cycle-by-cycle limit module can also terminate the switch drive signals if the current signal reaches the predetermined limit threshold before the duty cycle reaches the $D_{bl}$ limit. Therefore, the inputs $D_{act\_1}$ and $D_{act\_2}$ to the DPWM may equal $D_{bl\_1}$ and $D_{bl\_2}$, or be a lower value. At this time, the actual output duty cycle will be recorded as $D_{ini}$, and k.

Figure 7A:
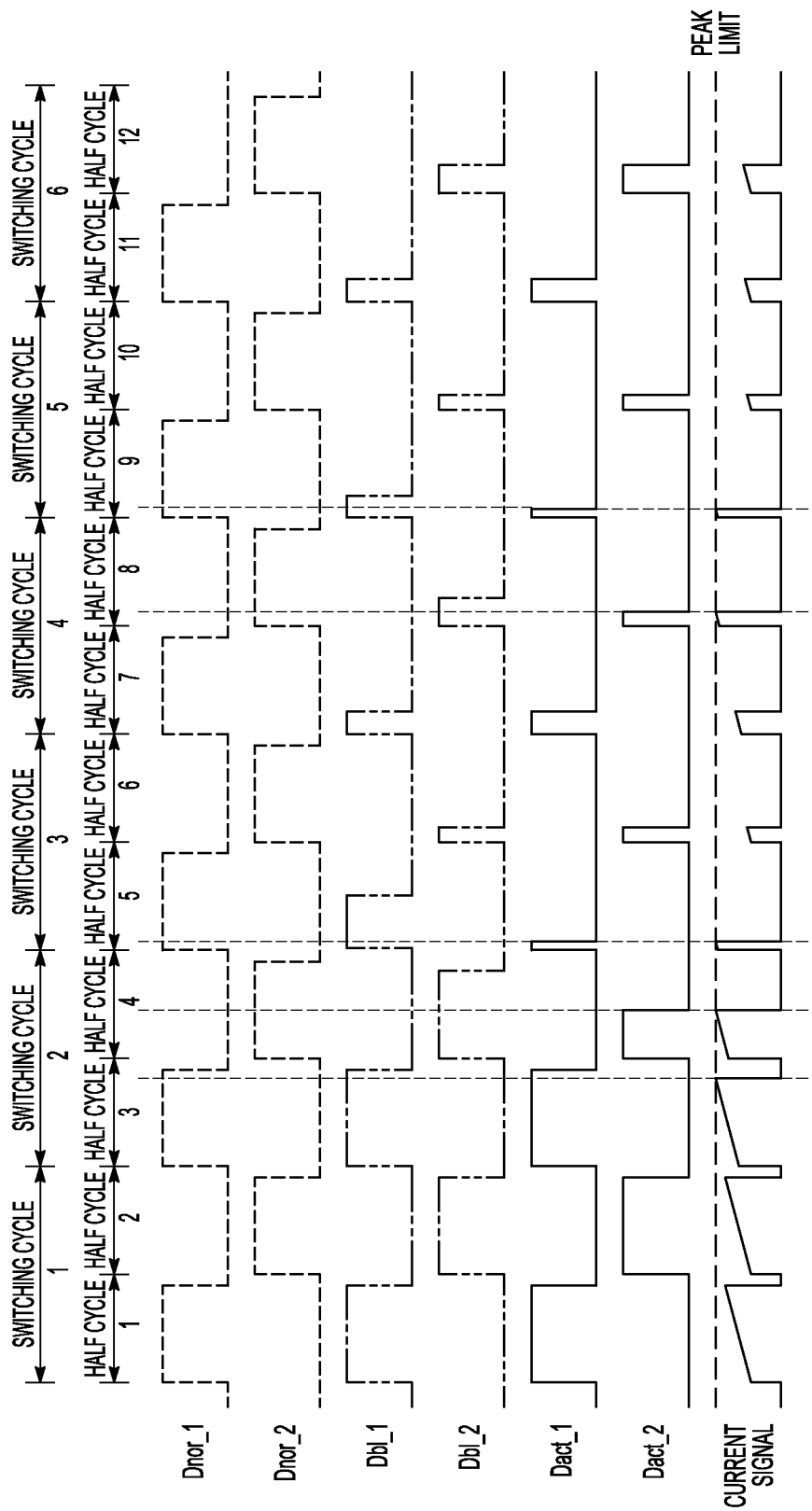
FIG. 7a is a timing diagram for a half-bridge switch mode converter which includes a cycle-by-cycle limit module and another possible implementation of a DCBM as described herein.

Proposal 2 is illustrated in FIGS. 7a and 7b under the same conditions as before. Assume the DCBM limits the duty cycle from half-cycle 4, since $D_{bl\_1}$ and $D_{bl\_2}$ can only increase by a preset increment—4.5% in this example—from the initial value determined by the cycle-by-cycle limit module.

A third embodiment ("proposal 3") of the DCBM does not compensate the duty cycle directly, but rather, when the cycle-by-cycle limit is triggered, forces the duty cycle in a given half-cycle to follow the actual duty cycle signal generated in the previous half-cycle. The principles of this DCBM are as follows:

- the actual ON time or duty cycle is recorded as $D_{pre}$ once the cycle-by-cycle limit module is triggered.
- if the cycle-by-cycle limit module is triggered in the previous half-cycle, the output duty cycle $D_{bl}$ of the DCBM in the next half-cycle is limited, in accordance with:

$$D_{bl\_1}=D_{pre} \text{ or } D_{bl\_2}=D_{pre}$$

if the cycle-by-cycle limit module is not triggered in the previous half-cycle, then the output of the DCBM in the next half-cycle is given by:

$$D_{bl\_1}=D_{nor\_1} \text{ or } D_{bl\_2}=D_{nor\_2}$$

the cycle-by-cycle limit module always has the highest priority. For example, assume that the switch drive signals are terminated in a previous half-cycle because of the cycle-by-cycle limit module and the actual duty cycle was recorded as $D_{pre}$ and used in the following half-cycle. After the cycle-by-cycle limit module receives the duty cycle signals $D_{bl\_1}$ and $D_{bl\_2}$ from the DCBM in the current half-cycle, the cycle-by-cycle limit module can also terminate the switch drive signals in the current half-cycle if the current reaches the reference limit threshold before the switch drive signal reaches the $D_{bl\_1}$ or $D_{bl\_2}$ value. Then, $D_{bl\_1}$ or $D_{bl\_2}$ in the next half-cycle must follow the actual duty cycle in the current half-cycle. Otherwise, $D_{bl\_1}$ and $D_{bl\_2}$ will revert to their normal values in the next half-cycle and wait for the next triggering of the cycle-by-cycle limit module.

The DCBM can be bypassed in the next half-cycle when the condition $D_{bl\_1}=D_{nor\_1}$ or $D_{bl2}=D_{nor\_2}$ is met in the current half-cycle, and re-activated when a new cycle-by-cycle limit module action is triggered.

Figure 8A:
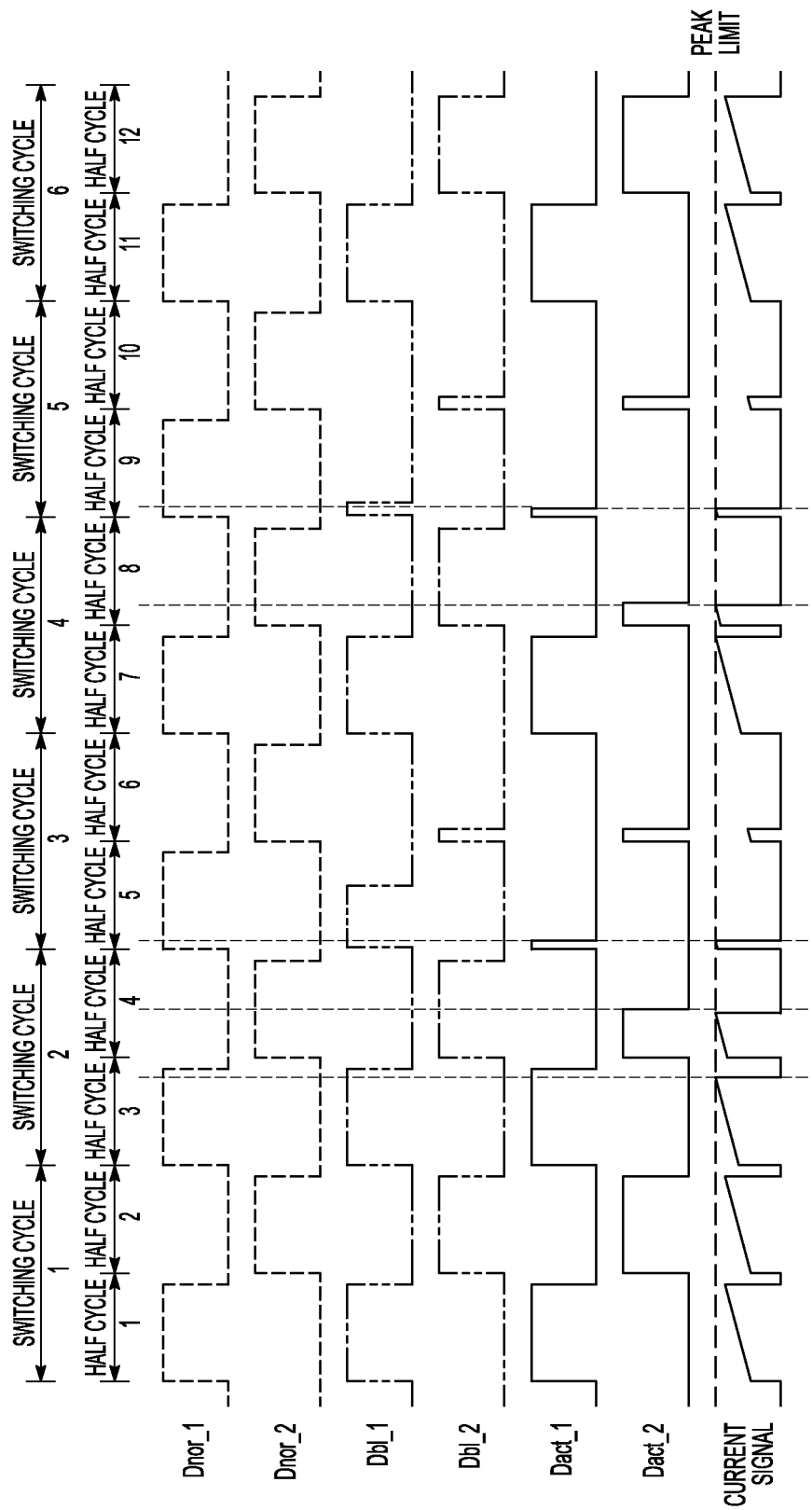
FIG. 8a is a timing diagram for a half-bridge switch mode converter which includes a cycle-by-cycle limit module and another possible implementation of a DCBM as described herein.

From the proposal 3 results shown in FIGS. 8a and 8b, it is seen that the cycle-by-cycle limit module is first triggered in half-cycle 3 (and then in half-cycles 4, 5, 8 and 9 as well). Then, the duty cycles in half-cycles 4, 5, 6, 9 and 10 are limited by the DCBM to match the duty cycle in the previous half-cycle; this is seen with reference to the $D_{bl\_1}$ and $D_{bl\_2}$ traces in FIG. 8a. In FIG. 8b, it is seen that this control method does not inevitably eliminate the duty cycle imbalance caused by the cycle-by-cycle limit module. However, when a large overcurrent condition occurs such as short circuit, the DCBM can prevent the trend of the voltage at center node B (shown in FIG. 1) drifting to ground or the input voltage, since the current signal is large enough to trigger the cycle-by-cycle limit module at least once in every switching cycle and limit the duty cycle or ON time to a very low value, resulting in the DCBM outputting the same low duty cycle in the next half-cycle. This is superior to having just cycle-by-cycle limit control, in which the duty cycle in the next half-cycle will revert to the normal value $D_{nor1}$ or $D_{nor2}$, resulting in positive feedback to the drifting trend such that the midpoint voltage of the capacitor divider may eventually drift to ground or the input voltage. The DCBM can suppress this trend by matching the duty cycles in both half-cycles, thereby pushing the midpoint voltage back towards $V_{in}/2$.

Though a half-bridge switch mode converter is used in the discussion above to illustrate the operation of the present DCBM, the DCBM is equally adaptable to other switch mode topologies, including those that employ pairs of switch drive signals such as a full-bridge, push-pull and 4-switch buck-boost converter topologies. As noted above, the DCBM can be adapted for use with both PWM and PFM switch drive signals; it is also applicable for phase-shift and resonant converters. It should also be noted that though the DCBM is described as reducing or eliminating duty cycle mismatch that arises due to the operation of a current limiting mechanism, it can also reduce mismatch that occurs due to other actions which can terminate the switch drive signals (or pairs of signals) asymmetrically and bring about mismatch.

Figure 9A:
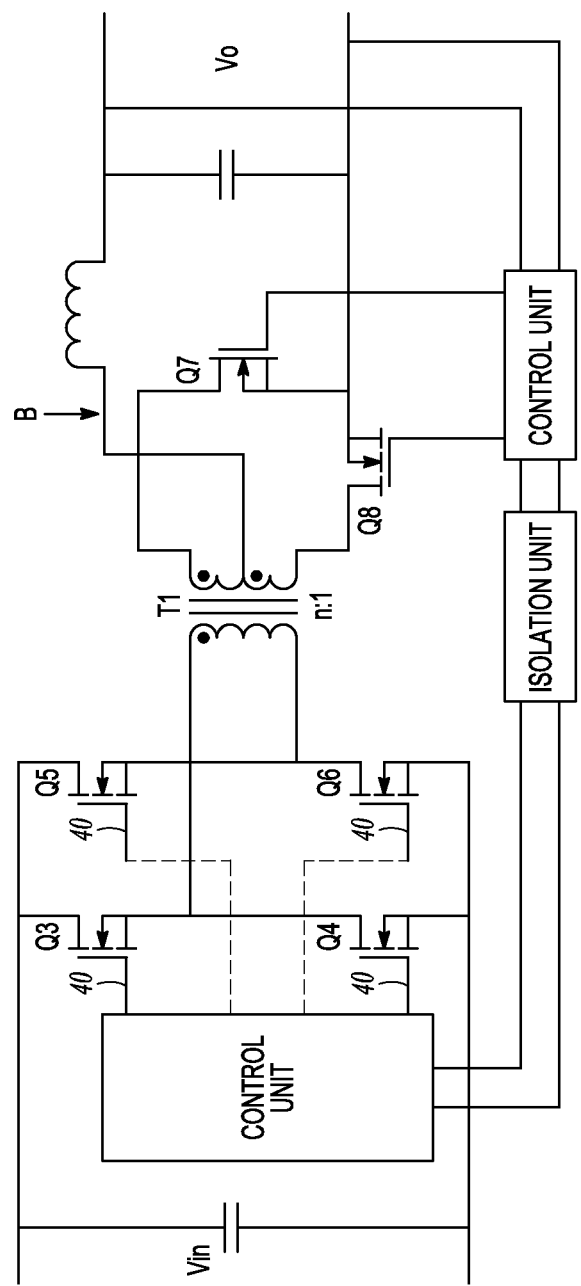
FIG. 9a is a schematic diagram of a full-bridge switch mode converter.

For example, a full-bridge topology is shown in FIG. 9. Here, there are four switching elements (Q3-Q6) and thus four switch drive signals. When so arranged, two switching elements must be on simultaneously for current to be conducted through transformer T1. For example, closing Q3 and Q6 causes current to flow through T1 in a first direction, while closing Q5 and Q4 causes current to flow through T1 in the opposite direction. Thus, pairs of drive signals (Q3/Q6 and Q5/Q4) are required to operate the converter.

Figure 9B:
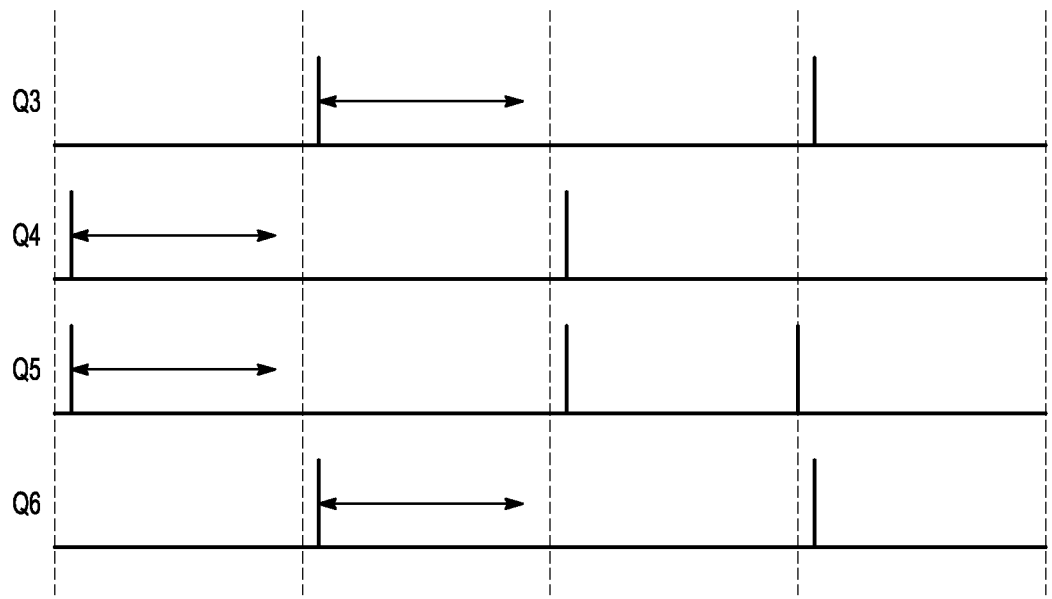

These pairs of drive signals can be modulated in various ways. For example, FIG. 9b illustrates simple hard switching modulation: Q3 and Q6 are driven with a common drive signal, and Q5 and Q4 are driven with a second drive signal. Here, the locations of the rising edges of the drive signals are fixed, while the falling edges—as indicated by the shaded areas—can vary as needed to regulate the output voltage.

Figure 9C:
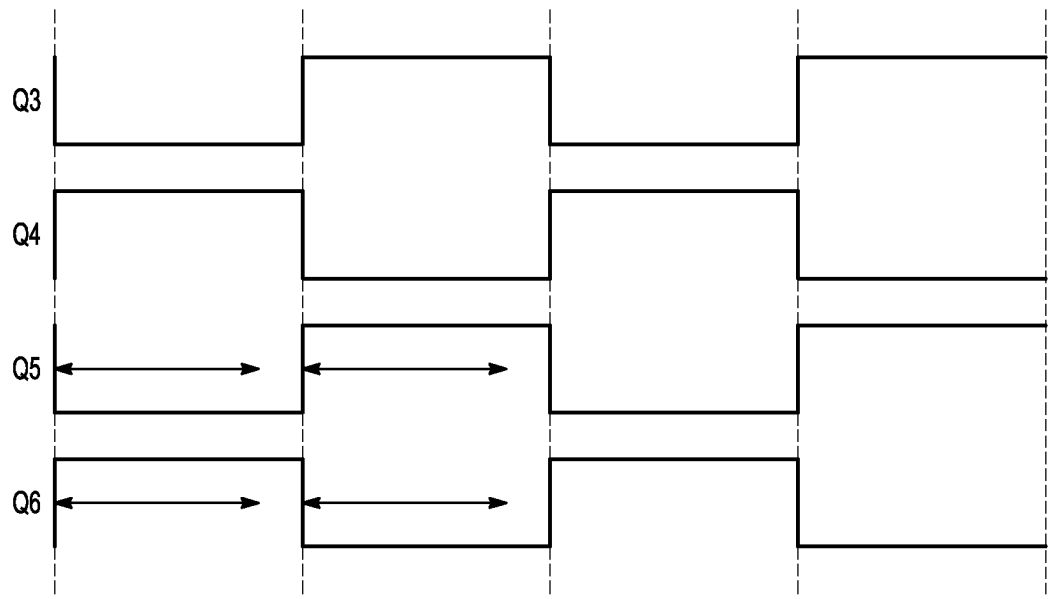
Figure 10:
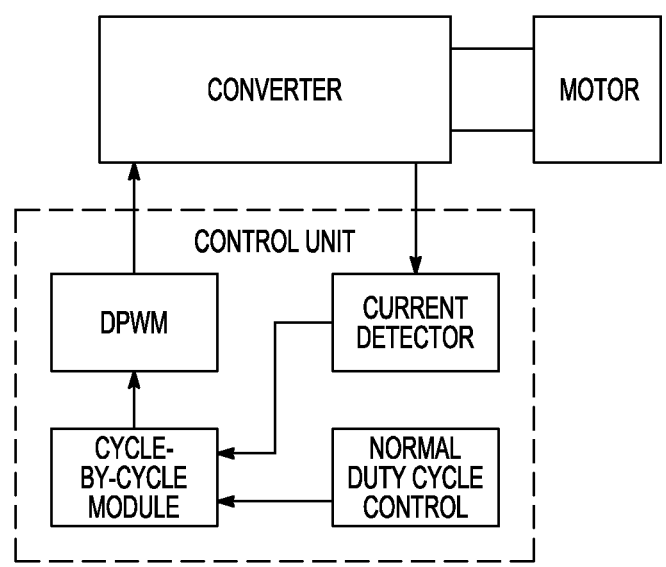

FIG. 9c depicts phase-shifted switching modulation. Here, all four switch drive signals have a fixed width, but the phase between the Q3 and Q6 drive signals, and between the Q4 and Q5 drive signals, shifts as needed to regulate the output voltage. This is accomplished by fixing the locations of the rising and falling edges for the switch drive signals provided to Q3 and Q4, but allowing the rising and falling edges for the Q5 and Q6 drive signals to occur anywhere within the shaded areas (while still maintaining a fixed width). As conduction only occurs when the Q3 and Q6 drive signals overlap, or the Q4 and Q5 drive signals overlap, these overlap times are equivalent to the ON times discussed above, with the ratios of the ON times to the switching period being the duty cycles as used herein. As with the examples described above, if the cycle-by-cycle limit module causes a mismatch between the overlapping times, the DCBM will operate to reduce the mismatch in accordance with the proposals discussed above. Note that by selecting appropriate components for the primary stage, the phase-shifted full bridge topology can achieve "zero voltage switching", meaning that the voltage across the switching elements is zero when driven from ON to OFF or OFF to ON; this is a "phase-shifted zero voltage converter".

To understand the use of a DCBM with a four drive signal arrangement, define the duty cycle for each switch drive signal as the ratio of its ON time to the period of the switching cycle. Then, divide the 4 signals into 2 pairs, with the signals which have similar duty cycle settings while in different half-cycles assigned into a pair; thus, with reference of FIG. 9c, for example, the switch drive signals for Q3 and Q4 would be considered as a first pair, while the drive signals for Q5 and Q6 form a second pair. Now, two signals in each pair can be modified in accordance with the proposals described above, to balance the duty cycle imbalance of 2 signals in each pair. The DCBM can be arranged such that it modifies either one pair or both pairs of signals.

Note that it is not essential that the DCBM provide its outputs to the cycle-by-cycle limit module. These modules could also be reversed, such that the cycle-by-cycle limit module provides its outputs to the DCBM, with the DCBM operating with the same principles as those described above.

It is also not essential that a cycle-by-cycle limit module as described herein be used. Any mechanism which is used to terminate the switch drive signals prematurely when some predefined condition is met might lead to a duty cycle imbalance; under these circumstances, a DCBM as described herein may be beneficially employed.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. An apparatus comprising:
a control unit configured for electrical coupling to a first switching element and a second switching element of a power converter circuit, the control unit including a duty cycle balance module configured to provide a first drive signal to a first switching element of the power convert circuit during an ON time of a first portion of an operating cycle, and providing a second drive signal to a second switching element of the power converter circuit during an ON time of a second portion of the operating cycle; and
a current detector configured to detect when operating current sensed in the power converter circuit exceeds a reference current limit,
wherein the duty cycle balance module is configured to: terminate the ON time of one of the first portion or second portion of the operating cycle when the operating current exceeds the reference current limit, subsequently provide the first and second drive signals to the first and second switching elements, and dynamically reduce mismatch, resulting from terminating the ON time of the one of the first portion or the second portion of the operating cycle, between the ON time of the first portion of the operating cycle and the ON time of the second portion of the operating cycle.

2. The apparatus of claim 1,
wherein the ON time of the first portion of the operating cycle is a pulse width of a first half-cycle of the operating cycle and the ON time of the second portion of the operating cycle is a pulse width of a second half-cycle of the operating cycle, and
wherein the duty cycle balance module is configured to calculate a mismatch between the pulse width of the first half-cycle and the pulse width of the second half-cycle and subtract the mismatch from one of the pulse width of the first half-cycle and the pulse width of the second half-cycle.

3. The apparatus of claim 2,
wherein the control unit is configured to determine a normal pulse width value for regulation of the power converter circuit, and
wherein the duty cycle balance module is configured to calculate a mismatch between the pulse width of the first half-cycle and the pulse width of the second half-cycle using summation of a total duty cycle loss occurring over multiple operating cycles in which the sensed operating current exceeds the reference current limit, and subtract the total duty cycle loss from the normal pulse width value.

4. The apparatus of claim 1,
wherein the ON time of the first portion of the operating cycle is a pulse width of a first half-cycle of the operating cycle and the ON time of the second portion of the operating cycle is a pulse width of a second half-cycle of the operating cycle, wherein each half-cycle has a minimum pulse width,
wherein the control unit is configured to determine a normal pulse width value for regulation of the power converter circuit, and
wherein the duty cycle balance module is configured to:
determine a pulse width value of a limited half-cycle, wherein the limited half-cycle is a latest half-cycle limited by the sensed operating current exceeding the reference current limit; and iteratively increase the pulse width of the first and second half-cycles, by a half-cycle increment value, from the pulse width value of the limited half-cycle to the normal pulse width value.

5. The apparatus of claim 4, wherein the duty cycle balance module is configured to increase the pulse width of a half-cycle by adding the increment value to the pulse width value of the immediately previous half-cycle.

6. The apparatus of claim 4, wherein the duty cycle balance module is configured to increase the pulse width of a half-cycle by adding a multiple of the increment value to the pulse width value of the limited half cycle.

7. The apparatus of claim 1,
wherein the ON time of the first portion of the operating cycle is a pulse width of a first half-cycle of the operating cycle and the ON time of the second portion of the operating cycle is a pulse width of a second half-cycle of the operating cycle, wherein each half-cycle has a minimum pulse width,
wherein the control unit is configured to determine a normal pulse width value for regulation of the power converter circuit,
wherein the duty cycle balance module is configured to:
determine a pulse width value of a limited half-cycle, wherein the limited half-cycle is a latest half-cycle limited by the sensed operating current exceeding the reference current limit;
set the pulse width of a half-cycle following the limited half-cycle to the pulse width value of the limited half-cycle; and
set the pulse width of subsequent half-cycles to the normal pulse width value when the sensed operating current does not exceed the reference current limit.

8. The apparatus of claim 1, wherein the control unit is configured for electrical coupling to a first switching element and a second switching element of a half bridge switch mode power converter circuit.

9. A method of operating a power converter circuit, the method comprising:
providing a first drive signal to a first switching element of the power convert circuit during an ON time of a first portion of an operating cycle, and providing a second drive signal to a second switching element of the power converter circuit during an ON time of a second portion of the operating cycle;
comparing an operating current in the power converter circuit to a reference current limit;
terminating an ON time of one of the first portion of the operating cycle or the second portion of the operating cycle when the operating current exceeds the reference current limit during that ON time; and
providing the first and second drive signals to the first and second switching elements while dynamically reducing mismatch between the ON time of the first portion of the operating cycle and the ON time of the second portion of the operating cycle resulting from the terminating of the ON time of the one of the first portion of the operating cycle or the second portion of the operating cycle.

10. The method of claim 9,
wherein the ON time of the first portion of the operating cycle is a pulse width of a first half-cycle of the operating cycle and the ON time of the second portion of the operating cycle is a pulse width of a second half-cycle of the operating cycle, and
wherein dynamically reducing the mismatch between the ON time of the first portion of the operating cycle and the ON time of the second portion of the operating cycle includes calculating a mismatch between the pulse width of the first half-cycle and the pulse width of the second half-cycle and subtracting the mismatch from one of the pulse width of the first half-cycle and the pulse width of the second half-cycle.

11. The method of claim 10, including determining a normal pulse width value for regulation of the power converter circuit, and
wherein calculating the mismatch includes calculating a mismatch between the pulse width of the first half-cycle and the pulse width of the second half-cycle by summing duty cycle loss occurring over multiple operating cycles to obtain a total duty cycle loss and subtracting the total duty cycle loss from the normal pulse width value to determine at least one of the pulse width of the first half-cycle or the pulse width of the second half-cycle.

12. The method of claim 9,
wherein the ON time of the first portion of the operating cycle is a pulse width of a first half-cycle of the operating cycle and the ON time of the second portion of the operating cycle is a pulse width of a second half-cycle of the operating cycle, wherein each half-cycle has a minimum pulse width, and
wherein the method further includes: determining a normal pulse width value for regulation of the power converter circuit; determining a pulse width value of a limited half-cycle, wherein the limited half-cycle is a latest half-cycle limited by the sensed operating current exceeding the reference current limit; and iteratively increasing the pulse width of the first and second half-cycles, by a half-cycle increment value, from the pulse width value of the limited half-cycle to the normal pulse width value.

13. The method of claim 9,
wherein the ON time of the first portion of the operating cycle is a pulse width of a first half-cycle of the operating cycle and the ON time of the second portion of the operating cycle is a pulse width of a second half-cycle of the operating cycle, wherein each half-cycle has a minimum pulse width, and
wherein the method further includes: determining a normal pulse width value for regulation of the power converter circuit; determining a pulse width value of a limited half-cycle, wherein the limited half-cycle is a latest half-cycle limited by the sensed operating current exceeding the reference current limit; setting the pulse width of a half-cycle following the limited half-cycle to the pulse width value of the limited half-cycle; and setting the pulse width of subsequent half-cycles to the normal pulse width value when the sensed operating current does not exceed the reference current limit.

14. The method of claim 9, wherein providing the first drive signal and the second drive signal includes providing the drive signals according to pulse width modulation (PWM) to regulate an output of the power converter circuit.

15. The method of claim 9, wherein the power converter circuit includes at least one of a half bridge switch mode power converter circuit, a full bridge switch mode power converter circuit, or a push-pull power converter circuit.

16. A switching power converter circuit comprising:
a first switching element;
a second switching element;
an electromagnetic component;
a control unit configured for electrical coupling to the first switching element and the second switching element the control unit including a duty cycle balance module configured to provide a first drive signal to a first switching element of the power convert circuit during an ON time of a first portion of an operating cycle, and providing a second drive signal to a second switching element of the power converter circuit during an ON time of a second portion of the operating cycle; and a current detector configured to detect when operating current sensed in the power converter circuit exceeds a reference current limit, wherein the duty cycle balance module is configured to: terminate the ON time of one of the first portion or second portion of the operating cycle when the operating current exceeds the reference current limit, subsequently provide the first and second drive signals to the first and second switching elements, and dynamically reduce mismatch, resulting from terminating the ON time of the one of the first portion or second portion of the operating cycle, between the ON time of the first portion of the operating cycle and the ON time of the second portion of the operating cycle.

17. The switching power converter circuit of claim 16,
wherein the ON time of the first portion of the operating cycle is a pulse width of a first half-cycle of the operating cycle and the ON time of the second portion of the operating cycle is a pulse width of a second half-cycle of the operating cycle, and
wherein the duty cycle balance module is configured to calculate a mismatch between the pulse width of the first half-cycle and the pulse width of the second half-cycle and subtract the mismatch from one of the pulse width of the first half-cycle and the pulse width of the second half-cycle.

18. The switching power converter circuit of claim 16,
wherein the ON time of the first portion of the operating cycle is a pulse width of a first half-cycle of the operating cycle and the ON time of the second portion of the operating cycle is a pulse width of a second half-cycle of the operating cycle, wherein each half-cycle has a minimum pulse width, wherein the control unit is configured to determine a normal pulse width value for regulation of the power converter circuit, and wherein the duty cycle balance module is configured to:
determine a pulse width value of a limited half-cycle, wherein the limited half-cycle is a latest half-cycle limited by the sensed operating current exceeding the reference current limit; and iteratively increase the pulse width of the first and second half-cycles, by a half-cycle increment value, from the pulse width value of the limited half-cycle to the normal pulse width value.

19. The switching power converter circuit of claim 16,
wherein the ON time of the first portion of the operating cycle is a pulse width of a first half-cycle of the operating cycle and the ON time of the second portion of the operating cycle is a pulse width of a second half-cycle of the operating cycle, wherein each half-cycle has a minimum pulse width, wherein the control unit is configured to determine a normal pulse width value for regulation of the power converter circuit, wherein the duty cycle balance module is configured to:
determine a pulse width value of a limited half-cycle, wherein the limited half-cycle is a latest half-cycle limited by the sensed operating current exceeding the reference current limit;

set the pulse width of a half-cycle following the limited half-cycle to the pulse width value of the limited half-cycle; and set the pulse width of subsequent half-cycles to the normal pulse width value when the sensed operating current does not exceed the reference current limit.

20. The switching power converter circuit of claim 16, wherein the switching power converter circuit has a half bridge, full-bridge or push-pull circuit topology, and the electromagnetic component is a transformer.

* * * * *